(12) United States Patent
Maula (10) Patent No.: US 8,945,676 B2
(45) Date of Patent: Feb. 3, 2015

(54) METHOD AND APPARATUS FOR COATING (75) Inventor: Jarmo Maula, Espoo (FI)

(73) Assignee: Beneq Oy, Vantaa (FI)

( * ) Notice: Subject to any disclaimer, the term of this patent is extended or adjusted under 35 U.S.C. 154(b) by 124 days.

(21) Appl. No.: 13/258,152

(22) PCT Filed: Mar. 25, 2010

(86) PCT No.: PCT/FI2010/050234
§ 371 (c)(1),
(2), (4) Date: Sep. 21, 2011

(87) PCT Pub. No.: WO2010/109076
PCT Pub. Date: Sep. 30, 2010

(65) Prior Publication Data
US 2012/0015106 A1    Jan. 19, 2012

(30) Foreign Application Priority Data
Mar. 25, 2009  (FI) .................................... 20095307

(51) Int. Cl.
C23C 16/00       (2006.01)
B05D 7/00        (2006.01)
C23C 16/455      (2006.01)
B01J 2/00        (2006.01)
C23C 16/40       (2006.01)

(52) U.S. Cl.
CPC .......... C23C 16/45551 (2013.01); B01J 2/006 (2013.01); C23C 16/403 (2013.01); Y02T 50/67 (2013.01)
USPC ...................... 427/255.5; 427/248.1; 427/213

(58) Field of Classification Search
CPC .............. C23C 16/54; C23C 16/45551; C23C 16/45548; C23C 16/45544; C23C 16/45519; C23C 16/455; C23C 16/44; C23C 16/4417; C23C 16/442; B01J 2/16

USPC .......................... 427/213, 255, 248.1, 248.15
See application file for complete search history.

(56) References Cited

U.S. PATENT DOCUMENTS

| 4,859,493 A | 8/1989 | Lemelson |
| 7,132,697 B2 | 11/2006 | Weimer et al. |
| 7,396,862 B2 | 7/2008 | Weimer et al. |
| 2006/0193978 A1 | 8/2006 | Toth |

(Continued)

FOREIGN PATENT DOCUMENTS

WO    WO 2006/135377 A2    12/2006

OTHER PUBLICATIONS

McCormick et al. Rotary reactor for atomic layer deposition on large quantities of nanoparticles, J. Vac. Sci. Technol. A, 25(1), Jan./Feb. 2007, pp. 67-74.*

(Continued)

*Primary Examiner* — Kelly M Gambetta
(74) *Attorney, Agent, or Firm* — Merchant & Gould P.C.

(57) ABSTRACT

The invention relates to a method and an apparatus for coating one or more objects (1) by exposing an object (1) to alternately repeating surface reactions of two or more gaseous precursors. The apparatus comprises a reaction chamber (2, 40), means for forming at least one distinct precursor region inside the reaction chamber, and means for causing translational, essentially mechanically unsupported and unsuspended, motion of an object (1) inside the reaction chamber, relative to the reaction chamber, for bringing the surface of the object (1) into contact with a gaseous precursor, the means for causing the translational motion comprising means for moving the object (1) essentially through the at least one distinct precursor region inside the reaction chamber.

10 Claims, 7 Drawing Sheets

(56) References Cited

U.S. PATENT DOCUMENTS

2007/0215036 A1* 9/2007 Park et al. .................. 117/88
2007/0298250 A1 12/2007 Weimer et al.
2009/0078204 A1* 3/2009 Kerr et al. .................. 118/728
2009/0291209 A1* 11/2009 Granneman et al. ....... 427/255.5

OTHER PUBLICATIONS

McCormick, J. et al. "Rotary reactor for atomic layer deposition on large quantities of nanoparticles", J. Vac. Sci. Technol. A., vol. 25, No. 1, Jan./Feb. 2007, pp. 67-74.

Wank, J. et al. "Vibro-fluidization of fine boron nitride powder at low pressure", Powder Technology, vol. 121, No. 2-3, 2001, pp. 195-204.

Watano, S. et al. "Microgranulation of fine powders by a novel rotating fluidized bed granulator", Powder Technology, vol. 131, No. 2-3, 2003, pp. 250-255.

International Search Report for corresponding International Patent Application No. PCT/FI2010/050234 mailed Aug. 25, 2010.

Finnish Search Report for corresponding Finnish Patent Application No. 20095307 mailed Nov. 23, 2009.

* cited by examiner

METHOD AND APPARATUS FOR COATING

This application is a National Stage Application of PCT/FI2010/050234, filed 25 Mar. 2010, which claims benefit of Serial No. 20095307, filed 25 Mar. 2009 in Finland and which applications are incorporated herein by reference. To the extent appropriate, a claim of priority is made to each of the above disclosed applications.

FIELD OF THE INVENTION

The present invention relates to processing technology. Especially the present invention relates to a method and an apparatus for coating or treating objects.

BACKGROUND OF THE INVENTION

Atomic Layer Deposition (ALD) is a well known method for depositing uniform and conformal thin-films over substrates of various shapes, even over complex 3D (three dimensional) structures. In ALD the coating is grown by alternately repeating, essentially self-limiting, surface reactions between a precursor and a surface to be coated. Therefore the growth mechanism in an ALD process is commonly not as sensitive as other coating methods to e.g. the flow dynamics inside a reaction chamber which may be a source for non-uniformity, especially in coating methods relying on gas-phase reactions. In an ALD process two or more different reactants (precursors) are introduced to the reaction chamber in a sequential, alternating, manner and the reactants adsorb on surfaces, e.g. on a substrate, inside the reaction chamber. The sequential, alternating, introduction of reactants is commonly called pulsing (of reactants).

In between each reactant pulse there is commonly a purging period during which a flow of inert gas, often called the carrier gas, purges the reaction chamber from e.g. surplus precursor and by-products resulting from the adsorption reactions of the previous precursor pulse. A film can be grown by an ALD process by repeating several times a pulsing sequence comprising the aforementioned reactant pulses and purging periods. The number of how many times this sequence called the "ALD cycle" is repeated depends on the targeted film, or coating, thickness.

A problem with known coating methods and apparatuses is the mechanical screening of the substrate object by a supporting structure. The fact, that the object to be coated commonly rests on a supporting frame, or on another supporting structure such as the bottom of a reaction chamber, almost inevitably leads to non-uniformities in the deposited coating. This problem is exacerbated when the coating is applied on small objects or powders comprising many small objects (i.e. small particles) that may be in contact with, or reside very close to, each other in addition to resting on a supporting structure. This may cause screening of the objects in many places of its surface.

Coating methods employed because of their potential for highly uniform and conformal coatings, such as ALD or other methods based on alternately repeating surface reactions, may loose some of their key benefit of conformality and uniformity due to the aforementioned screening problem. This occurs especially when a uniform and/or conformal coating is required all around an object/substrate.

Some methods have been proposed to alleviate this problem by causing the objects to become separated during the coating process. For example U.S. Pat. No. 7,132,697 and U.S. Pat. No. 7,396,862 disclose the formation of a fluidized bed of particles to be coated in an ALD process. The particles to be coated are fluidized by injecting a fluidizing gas through a bed of particles, which lifts the particles upwards, mechanically suspending them and dispersing them in the fluidizing gas. Patent application publication WO2006/135377 discloses an ALD coating method in which particles are fluidized by intermittently suspending them above a supporting surface. In practice the suspension is carried out by an ultrasonic source.

Some drawbacks of the discussed coating methods of the prior art are the limitation of the size, weight, number or total volume of objects that can be coated. E.g. an ultrasonic source is not able to efficiently separate larger or heavier objects from each other by fluidizing them. This is especially true for big numbers of these objects. Additionally it is problematic for the proposed arrangement in patent application publication WO2006/135377 to even handle big numbers or volumes of objects (particles) to be coated. Utilizing a high pressure gas stream, as in U.S. Pat. No. 7,132,697 and U.S. Pat. No. 7,396,862, for fluidization will not markedly alleviate these problems. Furthermore, using a gas stream for fluidizing the objects to be coated poses additional difficulties in suitably arranging precursor flows inside a reaction chamber. Arrangements of the prior art additionally require complex electrical and/or mechanical constructions to realize an ultrasonic or a high pressure gas assisted fluidization systems.

PURPOSE OF THE INVENTION

A purpose of the present invention is to reduce the aforementioned technical problems of the prior-art by providing a new type of method and apparatus suitable for coating large numbers of objects of various size and shape cost-effectively with good uniformity.

SUMMARY OF THE INVENTION

The method according to the present invention is characterized by what is presented in independent claim 1.

A method according to the present invention, for coating one or more objects, comprises; introducing a first precursor to a reaction chamber; introducing a second precursor to the reaction chamber; and exposing an object to alternately repeating surface reactions of two or more gaseous precursors inside the reaction chamber. Further, the method comprises forming at least one distinct precursor region inside the reaction chamber, and causing translational, essentially mechanically unsupported and unsuspended, motion of an object inside the reaction chamber, relative to the reaction chamber, for bringing the surface of the object into contact with a gaseous precursor, and for moving the object essentially through the at least one distinct precursor region inside the reaction chamber.

An apparatus, according to the present invention, for coating one or more objects by exposing an object to alternately repeating surface reactions of two or more gaseous precursors, comprises; a reaction chamber; at least one input and at least one output connected to the reaction chamber, for feeding gaseous material in and exhausting gaseous material out of the reaction chamber, respectively. Further, the apparatus comprises means for forming at least one distinct precursor region inside the reaction chamber; and means for causing translational, essentially mechanically unsupported and unsuspended, motion of an object inside the reaction chamber, relative to the reaction chamber, for bringing the surface of the object into contact with a gaseous precursor, the means for causing the translational motion comprising means for moving the object (1) essentially through the at least one distinct precursor region inside the reaction chamber.

According to one embodiment of the present invention the reaction chamber comprises at least one chamber.

According to one embodiment of the present invention the reaction chamber comprises one chamber inside of which at least one distinct precursor region is formed. According to one embodiment of the present invention the reaction chamber comprises two or more chambers connected in line. The connection can be performed in any suitable manner, e.g. by at least one pipework. In case the reaction chamber comprises two or more chambers the object is moved essentially through the different chambers.

According to one embodiment of the present invention each chamber comprises at least one distinct precursor region. According to one embodiment of the present invention only one precursor occupies one chamber. According to one embodiment of the present invention an inert gas is fed between each chamber separating in space the main flows of different precursors. In this context, exposure of an object to alternately repeating surface reactions should be understood as meaning an exposure of the object to surface reactions of two or more different precursors, one precursor at a time. This type of exposure is used e.g. in an ALD or in an ALD-like process.

In this context, "object" should be understood as meaning any solid structure including small, even nanoscale, particles.

In this context, gaseous precursor or precursor vapour should be understood as meaning any vaporized or volatilized material used as a precursor.

An advantage of the method and the apparatus according to the present invention is that they can be used to coat large volumes and/or numbers of objects cost effectively with good uniformity. The method and the apparatus of the present invention are suitable for e.g. coating material comprising small particles in large numbers and volumes, such as powders, although the invention is not limited to coating such objects or quantities in particular. Indeed, another advantage of the method and apparatus of the present invention is that they can also handle even heavy objects of various sizes and shapes.

As an object is brought into contact with a precursor by causing the object to move, e.g. "fly" or fall, essentially mechanically unsupported and unsuspended, into a zone (i.e. a distinct precursor region) occupied by a precursor inside the reaction chamber, the probability that there will be virtually no areas on the surface of the object that remain shielded from the precursor is high. Hence the surface reactions may occur essentially everywhere on the surface of the object. Causing translational, essentially mechanically unsupported and unsuspended, motion of an object inside the reaction chamber, relative to the reaction chamber, enables exposure of essentially the entire surface of the object to a gaseous precursor. This enables, with a high probability, good uniformity and good conformality for the coating. In the case of powder coating, or in processes where large volumes and/or numbers of particles or other objects are coated in the same reaction chamber, the objects may also shield each other from the precursors, if prior-art-techniques for coating objects by alternately repeating surface reactions are employed. By causing the objects or particles to move inside the reaction chamber such that the particles are mechanically unsupported can make the particles break away from each other, which increases the probability of full exposure of the surface of a particle to a precursor. This can naturally improve the uniformity of the coating, and makes the present invention suitable for e.g. uniformly coating large volumes and/or numbers of small particles.

According to one embodiment of the present invention the object is moved in whole through the at least one distinct precursor region. According to one embodiment of the present invention the object is moved essentially from one part of the at least one distinct precursor region to the opposite part of the at least one distinct precursor region.

Yet another benefit of some embodiments of the present invention is that pulsing (or "dosing") valves necessary for e.g. ALD reactors of the prior art may not be necessary and mass-flow controllers, capable of more accurate dosing than the dosing valves, may be used instead in a reactor employing some embodiments of the apparatus of the present invention. The dosing valves may not be necessary as different precursors do not have to be separated in the reaction chamber in time. Spatial separation of different precursors in the reaction space may be sufficient when the translational movement of the object brings the object into contact with a precursor; i.e. different precursors may be simultaneously present inside the reaction space as long as the different precursors are spatially separated inside the reaction space.

According to one embodiment of the method of the present invention, causing the translational, essentially mechanically unsupported and unsuspended, motion comprises causing the motion by rotating the reaction chamber, such that the gravitational force makes the object fall essentially through at least one distinct precursor region occupied by a precursor inside the reaction chamber.

According to one embodiment of the apparatus of the present invention, the means for causing translational, essentially mechanically unsupported and unsuspended, motion comprises means for rotating the reaction chamber, such that the gravitational force makes the object fall essentially through at least one distinct precursor region occupied by a precursor inside the reaction chamber.

According to one embodiment of the method of the present invention, the method comprises the step of transporting the object from one part of the reaction chamber into another part of the reaction chamber, the transport being carried outside the reaction chamber.

According to one embodiment of the apparatus of the present invention, the apparatus comprises means for transporting the object from one part of the reaction chamber into another part of the reaction chamber, the transport being carried outside the reaction chamber.

According to another embodiment of the method of the present invention, causing the translational, essentially mechanically unsupported and unsuspended, motion of an object makes the object move essentially through two or more distinct precursor regions occupied by at least two different precursors inside the reaction chamber, wherein only one precursor occupies one region.

A practical way of causing the mechanically unsupported motion of an object inside the reaction chamber is by rotating the reaction chamber, and thus making the object fall from one end of the reaction chamber, through the reaction chamber, to the other end of the reaction chamber, by the gravitational force. Precursors may be introduced to the reaction chamber such that when an object falls through the reaction chamber, it may fall across one or more regions occupied by a precursor, i.e. one or more distinct precursor regions, inside the reaction chamber. As the probability of the surface of the falling object being completely exposed to the environment is high, a gaseous precursor may react with essentially the entire surface of the object.

According to one embodiment of the present invention, exposing an object to alternately repeating surface reactions of two or more precursors comprises exposing the object to alternately repeating self-limiting surface reactions, for coating the object by atomic layer deposition.

When e.g. an atomic layer deposition (ALD) process is used to coat the object inside the reaction chamber, excellent uniformity and conformality of the coating may be obtained. As the surface reactions responsible for film growth on the object are self-limiting in ALD, exposure time of the object to the precursor is not critical and even a quick passage of the object through a region occupied by a precursor inside the reaction chamber may be sufficient to saturate the surface of the object, provided that the precursor gets into contact with the surface.

According to one embodiment of the method of the present invention, the method comprises the step of separating the main flow of each precursor inside a reaction space within the reaction chamber in time and/or in space, to prevent significant reactions from occurring between precursors in the gas phase.

According to one embodiment of the method of the present invention, the method comprises the step of feeding inert gas such that the main flow paths of different precursors are kept separated in space.

According to one embodiment of the method of the present invention, the method comprises the step of feeding at least two precursors simultaneously through the reaction chamber in gaseous form, the main flow path of one precursor inside the reaction space within the reaction chamber being separated from the main flow path of any other precursor.

According to one embodiment of the method of the present invention, the method comprises the step of feeding inert gas into the reaction space through an inlet for the inert gas located in between an inlet for a first precursor and an inlet for a second precursor, such that flow of the inert gas inside the reaction space is divided between a first outlet and a second outlet located at a distance from each other, for keeping the main flow paths of the first precursor and of the second precursor separated inside the reaction space.

According to one embodiment of the apparatus of the present invention, the apparatus comprises an inlet for inert gas for feeding inert gas such that the main flow paths of different precursors are kept separated in space.

According to one embodiment of the apparatus of the present invention, the apparatus comprises, a reaction space within the reaction chamber; a first outlet and a second outlet located at a distance from each other; and an inlet for an inert gas, located in between an inlet for the first precursor and an inlet for the second precursor, such that flow of the inert gas inside the reaction space is divided between the first outlet and the second outlet, for keeping the main flow paths of a first precursor and of a second precursor separated inside the reaction space.

The apparatus may, in one embodiment of the invention, be constructed such that two or more gaseous precursors are continuously introduced to the reaction chamber while ensuring that the precursors are not able to significantly interact with each other in the gas phase in, or before, the reaction chamber. This can be achieved by utilizing a flow of inert gas inside the reaction chamber to suitably guide the main flow of each precursor along their individual flow paths. The expression "main flow" should be understood as meaning the flow which is mainly a result of a difference in total pressure. This means that diffusive spreading of molecules in the gas phase would not be considered as part of the "main flow".

When two or more distinct regions of different precursors coexist inside the reaction chamber an object can be dropped through the regions in one pass through the reaction chamber. With a suitable choice of precursors the one pass can represent one ALD cycle in an ALD process. This enables a short time for the ALD cycle even if large volumes and/or numbers of small objects (particles) are coated. By making the small objects move (e.g. fall) back and forth through the precursor zones (i.e. precursor regions) inside the reaction chamber, by e.g. suitably rotating the reaction chamber, the thickness of the coating can be increased.

According to one embodiment of the apparatus of the present invention, the at least one inputs and the at least one outputs are located close to the axis of rotation of the reaction chamber to enable the use of an essentially rigid pipework.

According to one embodiment of the apparatus of the present invention, the pipework is made of flexible material to enable the rotation of the reaction chamber essentially regardless of the location of the at least one inputs and of the at least one outputs.

The reaction chamber may be connected to the rest of the reactor, e.g. an ALD reactor, via a pipework which is used to transport gases, e.g. the precursors, from their sources into the reaction chamber. To enable rotation or other type of movement of the reaction chamber with respect to the rest of the reactor, including the pipework, suitable parts of the pipework may be made of flexible material or the construction may be flexible otherwise. The connection points of the pipework may also be located on a rotation axis of the reaction chamber to minimize movement of the pipework when the reaction chamber is e.g. rotated.

According to one embodiment of the present invention the apparatus comprises a sealed joint in between the reaction chamber and a feedthrough into the reaction chamber, the sealed joint allowing the reaction chamber to be rotated relative to the feedthrough and comprising a purge flow channel in between the outside and the inside of the reaction chamber, the purge flow channel being in flow connection with a gas source for pressurizing the purge flow channel. This type of sealing arrangement enables good sealing of the reaction chamber from its environment while enabling rotation of the reaction chamber relative to the feedthrough.

According to one embodiment of the present invention the method comprises moving the object in an essentially unidirectional manner essentially through the at least one distinct precursor region during one pulsing sequence.

According to one embodiment of the present invention the apparatus comprises means for moving the object in an essentially unidirectional manner essentially through the at least one distinct precursor region during one pulsing sequence.

In this context "unidirectional" should be understood such that during one pulsing sequence, as defined above, the object is moved essentially from one part of the reaction chamber to another part of the reaction chamber in an essentially straight forward manner during which the object traverses at least one distinct precursor region.

The embodiments of the invention described hereinbefore may be used in any combination with each other. Several of the embodiments may be combined together to form a further embodiment of the invention. A method or an apparatus, to which the invention is related, may comprise at least one of the embodiments of the invention described hereinbefore.

DETAILED DESCRIPTION OF THE INVENTION

In the following, the present invention will be described in more detail with exemplary embodiments by referring to the accompanying figures, in which.

Figure 1:
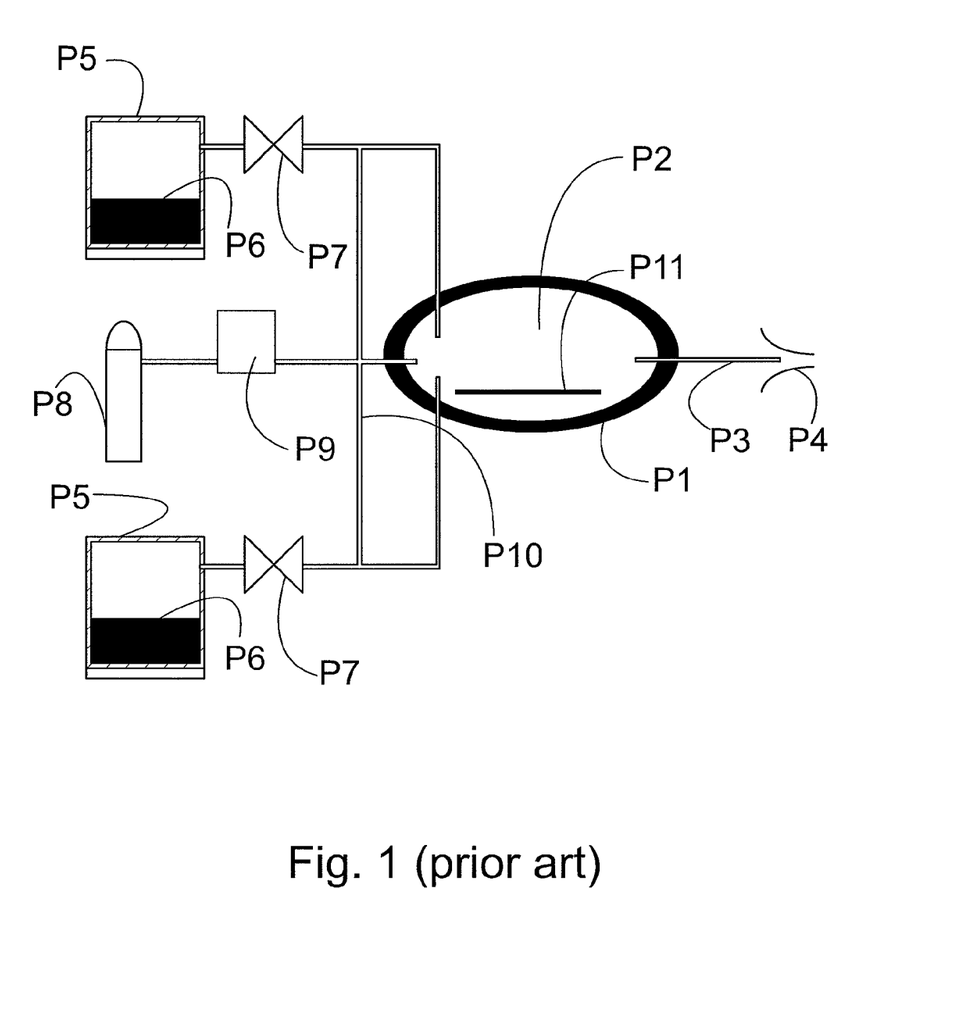
FIG. 1 is a schematic illustration of a conventional reactor of the prior art for atomic layer deposition.

An overview of an exemplary conventional ALD-reactor structure of the prior art, as presented in FIG. 1, comprises a reaction chamber P1 and a reaction space P2 within the reaction chamber P1. The ALD-reactor has an output P3 in flow connection with pumping equipment P4 for exhausting gases out of the reaction chamber P1 and for keeping the pressure of the reaction space P2 at a specified value. Precursor sources (containers) P5 hold the precursors P6 which are dosed into the reaction space P2 in gaseous form through pulsing valves (dosing valves) P7. Inert gas, often called carrier gas or purging gas, is stored in a gas cylinder P8 and is injected into the reaction chamber P1 through a mass flow controller P9. The pipework P10 of the ALD-reactor can be arranged such that the inert gas may flow through the channels used to input precursor P6 vapour into the reaction space P2. Therefore the inert gas can purge these channels from precursor P6 vapour during a purging period when the precursor P6 is not flowing in the input channel. During a precursor P6 pulse, on the other hand, the inert gas can carry the precursor P6 vapour rapidly into the reaction chamber P1 and bring the vapour into contact with the substrate P11 to be coated. In the conventional ALD reactor the precursors are alternately pulsed through the pulsing valves P7 and through the pipework P10 into the reaction space P2 during the process, so that the different precursors may flow into contact with the substrate P11 at different times, while the substrate P11 itself does not markedly move relative to the reaction chamber P1 during the process. The reaction chamber P1 also stays still relative to the pipework P10.

In the following, for reasons of simplicity, item numbers will be maintained in the exemplary embodiments below in the case of repeating components.

Schematic cross-sectional views of the apparatus according to one embodiment of the present invention are illustrated in FIGS. 2a-2d. The apparatus comprises a reaction chamber 2, two precursor inputs 4, 6 inert gas input 8 and an output 10. The inputs 4, 6, 8 and the output 10 are connected to the reaction chamber 2 in proximity to its axis of rotation 12. The reaction chamber 2 comprises a first container 14 and a second container 16 at the two ends of the reaction chamber 2 having an elongated midsection. Comprised within the reaction chamber 2 are also flow-guides; an input flow-guide 18 and an output flow-guide 30, and flexible restrictor elements 3. The restrictor elements 3 may also be rigid and they may also comprise more complex structures than just a flap-shaped structure illustrated in the figures. The purpose of these restrictor elements 3 is to control the falling of the objects 1 to be coated in order to e.g. adjust the density of the objects 1 that are falling inside the reaction chamber 2, or to help loading the objects 1 into the reaction chamber 2. This helps in keeping the objects 1 separated from each other during the fall.

Directions of gas flows through the reaction chamber 2 towards the output 10 are indicated by arrows in the figures. The apparatus also comprises means for rotating the reaction chamber around its axis of rotation 12. For simplicity, the means for rotating is not shown in the figures but in light of this disclosure the construction and placement of such a means will be clear for a skilled person. The means for rotating can be e.g. an electric motor or a pneumatic pressure driven actuator.

Figure 2A:
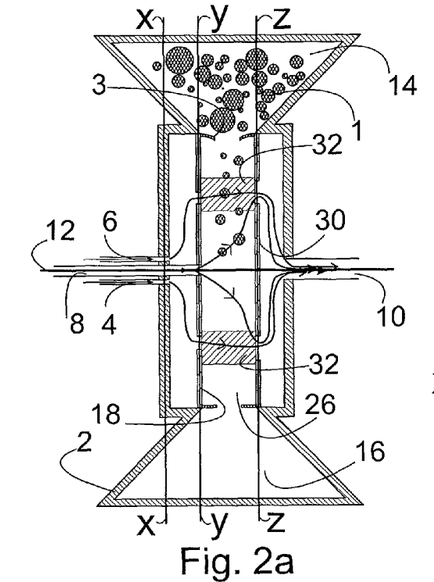
FIG. 2a is a schematic cross-section of an apparatus according to one embodiment of the present invention.
Figure 2B:
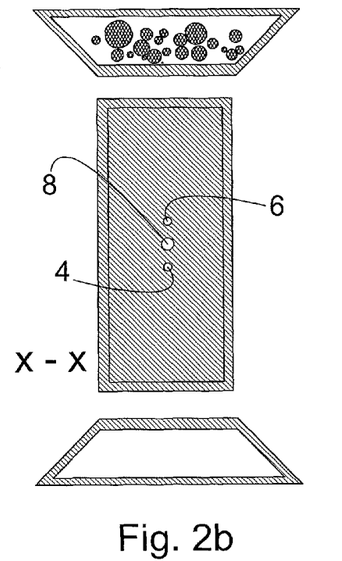
FIG. 2b is a schematic cross-section of the apparatus of FIG. 2a, FIG. 2c is another schematic cross-section of the apparatus of FIG. 2a, FIG. 2d is another schematic cross-section of the apparatus of FIG. 2a, FIG. 3a is a schematic cross-section of an apparatus according to one embodiment of the present invention.
Figure 2C:
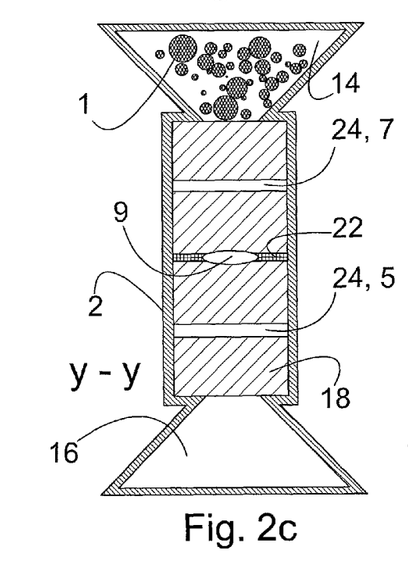
Figure 2D:
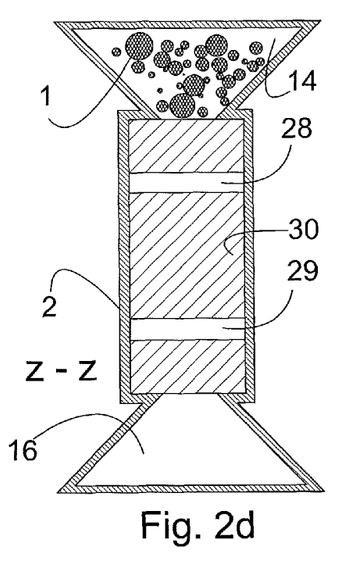

Object(s) 1 can be coated in the reaction chamber 2 of the exemplary embodiments by e.g. an ALD, or an ALD-like, process based on alternately repeating surface reactions of two or more different precursors. As described above an ALD reactor may also comprise e.g. pumping equipment in flow connection with the output 10, and other pipework for guiding e.g. carrier gas or other inert gas and the precursors into the reaction chamber from their respective sources. Although not required with the reaction chamber 2 according to some embodiments of the present invention, an ALD reactor may also comprise pulsing valves for dosing the precursors into the reaction chamber as discrete pulses, thus separating the precursors also in the time domain. Pulsing valves can also be used to control the consumption of possibly expensive precursor chemicals. It is furthermore possible to measure the amount of precursor on the exhaust side of the reaction chamber 2 (e.g. from the gas output 10) and to use this measurement result in a feedback loop to control the devices, e.g. mass-flow controllers and/or valves, responsible for feeding the precursors into the reaction chamber 2.

When the apparatus of FIG. 2a is used in an ALD reactor for coating objects 1 in an ALD process, the precursors can be introduced to the reaction chamber 2 through the precursor inputs 4, 6, each precursor from a different input. Also, essentially inert gas is introduced to the reaction chamber through the inert gas input 8, and to the reaction space 26 through the inert gas inlet 9. The essentially inert gas can be the same as the carrier gas used in an ALD process, e.g. nitrogen or argon. The two precursor inputs 4, 6 are located on different sides of a separator wall 22 located inside the reaction chamber 2. This wall 22 ensures that the different precursors do not interact with each other before flowing through the precursor inlets 5, 7 (gaps 24) in the input flow-guide 18; the first precursor through the inlet for the first precursor 5 and the second precursor through the inlet for the second precursor 7. I.e. the wall 22 serves the purpose of a mechanical barrier between precursors before the input flow-guide 18.

The inlet for the inert gas 9 introduces the inert gas directly into the reaction space 26 after the input flow-guide 18. In the reaction space 26 the flow of inert gas is divided into two streams towards the two gaps 28, 29 in the output flow-guide 30. The gaps 28, 29 are the first outlet 28 and the second outlet 29 for the flows out from the reaction space 26. The gaps 24 in the input flow-guide 18 are separated such that one precursor enters the reaction space 26 at a distance from any other precursor, and the inert gas inlet 9 at the end of the inert gas input 8 enters the reaction space 26 in between the inlets 5, 7 through which different precursors enter the reaction space 26, i.e. in between the gaps 24 in the input flow-guide 18.

The main flow path of each precursor is kept separate from the main flow path of any other precursor in the reaction space 26 by means of the suitably guided flow of inert gas. The inert gas is made to serve the purpose of a diffusion barrier minimizing gas phase interactions between precursors inside the reaction space 26. Gaps (outlets) 28, 29 in the output flow-guide 30 are suitably aligned with the gaps 24 (precursor inlets 5, 7) of the input flow-guide 18 so as to enable the formation of distinct precursor regions 32 in the reaction space 26. It is noted that, naturally, the separation of different precursors may possibly not be ideal inside the reaction space 26, but the diffusive properties of precursors or various process parameters may result in some precursor molecules of a different species to become into contact with each other. The inventive idea in this context is to guide the "main flow" of different precursors along their own separate flow paths, i.e. in their own distinct precursor regions, in the reaction space 26 so as to enable alternate exposure of the object(s) 1 to different precursors, while minimizing gas-phase reactions between different precursors. This facilitates or enables e.g. ALD- or ALD-like deposition of material on the object(s) 1.

The labelled precursor regions 32 in FIG. 2a are regions of the reaction space 26 most likely having a high concentration of a specific precursor. Although a gaseous precursor may spread towards the containers 14, 16 at the ends of the reaction chamber 2 by e.g. diffusion, this does not prevent ALD-like self limiting growth, as the inert gas barrier between the flow paths of different precursors enables confinement of the precursors into distinct regions 32. From the reaction space 2 in between the input 18 and the output 30 flow-guide the gases, including the precursors and the inert gas, flow into the output 10 through the outlets 28, 29 in the output flow-guide 30. An object can be uniformly coated by alternately repeating surface reactions (in e.g. an ALD process) in the reaction chamber 2 of the apparatus of FIG. 2a by causing the object 1 to move through the distinct precursor regions 32. This translational movement of an object 1 relative to the reaction chamber 2 can be brought about by rotating the reaction chamber 2 around the axis of rotation 12. This rotation causes the object 1 to fall from the container 14, 16 at one end of the elongated reaction chamber 2, through the distinct precursor regions 32 (zones) in the reaction space 26, to the other container 14, 16 at the other end of the reaction chamber 2. In one end-to-end passage the object 1 travels through two precursor regions 32 in the reaction chamber 2 of FIG. 2a. Depending on the particular process chemistry, which can be readily chosen by the skilled person, the two exposures of the falling object 1 to two different precursors in the distinct regions 32 can represent one ALD cycle. When the object 1 is to be coated with a thicker coating the reaction chamber 2 can be rotated, e.g. 180 degrees (i.e. "inverted", "turned upside-down" or "flipped over"), around the axis of rotation 12 causing the object 1 to fall through the two precursor regions 32 again, exposing the object 1 to (precursors of) a second ALD cycle. In this way the thickness of the coating can be controlled by choosing a suitable number of rotations causing the object 1 to travel through distinct precursor regions 32.

In this context "rotation" should be understood as a turning motion, wherein the degree of the turn is unspecified. A suitable degree of the rotation (turn) depends e.g. on the geometry of the reaction chamber 2 and on the desired type of translational motion of the object 1. In some embodiments of the invention a rotation of 180 degrees may be used.

Looking at FIGS. 2a-2d it will be appreciated that, to take full advantage of one end-to-end passage of the object 1, the inputs 4, 6 of the two different precursors should be switched after each end-to-end passage of the object 1. Switching the inputs 4, 6 after a complete end-to-end passage of an object 1 would ensure that, each time the object 1 moves through a precursor region 32, the precursor is different from the one which occupied the precursor region 32 that the object 1 previously moved through. When switching the precursor inputs 4, 6 a purging period may be required to ensure that reactive elements, e.g. surplus precursors, are flushed away from the reaction chamber 2 and from the precursor inputs 4, 6 before altering the flow configuration of the precursors.

However, switching of the inputs 4, 6 is not necessary for the apparatus (and for the corresponding coating process) of FIGS. 2a-2d to work as the object 1 will be exposed to a different precursor, other than the one with which the object 1 previously interacted, even without switching the inputs 4, 6. The switching of the inputs 4, 6 would enable two alternations of the interacting precursor in one end-to-end passage, as opposed to only one alternation obtained when the inputs 4, 6 for the two precursors are not switched. More precisely, when the inputs 4, 6 are not switched the object 1 will fall, in one end-to-end passage through the reaction chamber 2, through a precursor region 32 occupied by a first precursor and then through a precursor region 32 occupied by a sec- and precursor. After rotating the reaction chamber 2, the same object 1 will in the next end-to-end passage fall first through a precursor region 32 occupied by the second precursor again and then through a precursor region 32 occupied by the first precursor. Therefore only one alternation of a precursor would result, without switching the inputs 4, 6 after an end-to-end passage of the object 1 through the reaction space 26.

In one embodiment of the present invention, the precursors may be specifically guided towards the containers 14, 16 at the ends of the reaction chamber 2 in the apparatus of FIG. 2a. In this way the object 1 may continuously be exposed to a precursor in a container 14, 16. After rotating the reaction chamber 2, as the object falls through the reaction space 26, those parts of the surface of the object 1 which were shielded in the container 14, 16 may now be exposed to the precursor. When the object 1 falls through the middle part of the reaction space 26, unoccupied by a precursor, the surface of the object 1 gets purged from that precursor. When the object 1 continues falling through the reaction space and enters the other precursor region 32 occupied by a different precursor in the other end of the reaction chamber 2, the object 1 gets exposed to this precursor and the exposure continues even after the object 1 has arrived into the container 14, 16. Hence, in this embodiment, the exposure time of the object 1 to a precursor can be easily increased. Longer exposure times may in some ALD- or ALD-like processes improve uniformity and conformality of the coating, especially when the surface of the object 1 contains surface structures with a high aspect ratio.

In a variation of the embodiment of the previous chapter a precursor source itself may be placed in a container 14, 16 at the end of the reaction space. In this case vapour of this precursor does not have to be input to the reaction space 26 through a precursor input 4, 6, as the vapour is introduced to the reaction space 26 by generating the vapour inside the reaction chamber 2. E.g. a piece solid precursor may be attached in the reaction chamber 2 in a container 14, 16 such that the piece will not fall through the reaction space 26 when the reaction chamber 2 is rotated. This embodiment may be useful when precursors with a low value of saturated vapour pressure are used, as their delivery into the reaction space 26 through a pipework may be challenging. It may also make the use of precursors more efficient and therefore reduce the cost of the process.

According to different embodiments of the invention, there are several different mechanical designs to allow for the rotation and the switching of the precursor inputs 4, 6 of the apparatus. The first design, the one used in the apparatus of FIGS. 2a-2d, is to have the precursor inputs 4, 6, the inert gas input 8 and the output 10 fixed to the reaction chamber 2 structure. In this case these parts rotate together with the reaction chamber 2 and they are placed close to the axis of rotation 12 to minimize their movement or twisting. In this case the inputs 4, 6, 8 and the output 10 may be connected to the rest of an ALD reactor using an essentially rigid pipework with sealing systems allowing for rotation, or only partly flexible pipework. Using a completely flexible pipework to connect the precursor and/or the output flow paths to the apparatus of FIGS. 2a-2d will naturally allow a more flexible placing of the inputs 4, 6, 8 and/or the output 10 relative to the reaction chamber 2. In light of the above disclosure the details of the mechanical construction utilized to connect the apparatus of FIGS. 2a-2d to the rest of a reactor system will be obvious to the skilled person. As an example, switching of the precursor inputs 4, 6 can be done by e.g. using valves in the pipework of an ALD reactor to guide the flow of the precursors to different inputs 4, 6 after the object 1 has undergone an end-to-end passage, e.g. after a 180 degree rotation of the reaction chamber 2.

In order to perform in-situ measurements of the growing film, a monitor substrate may, in some embodiments of the invention, be inserted into the gas output 10. The properties of the growing film may be measured from the surface of this substrate e.g. optically. In this case, however, it should be noted that to obtain reliable data about the film growth, the growth mechanism of the film over the monitor substrate should be as close as possible to the growth mechanism of the film inside the reaction space 26. These types of in-situ measurements may necessitate that, with these embodiments of the invention, gas phase reactions between different precursors be minimized before the monitor substrate by e.g. time domain separation.

An alternative way to connect the reaction chamber 2 to the rest of a reactor system is to allow the reaction chamber 2 to rotate around the precursor inputs 4, 6, the inert gas input 8 and the output 10. This embodiment of the invention is shown in FIGS. 3a-3e. In this case the inputs 4, 6, 8 and the output are a part of the rotation axis 12 and they are fixed to the rest of the reactor structure (not to the reaction chamber 2) even when the reaction chamber 2 is rotating. This would enable the use of a completely rigid pipework connecting the inputs 4, 6, 8 and the output 10 to precursor and inert gas sources and to a vacuum pumping system, respectively. However, this construction also requires that the input area 34 and the output area 36, not being fixed to the reaction chamber 2 structure, be carefully sealed so as to prevent leakage of gases through the joint in between the reaction chamber 2 and the input 34 and the output 36 areas. For this purpose sealing systems allowing for rotation can be used.

Figure 3A:
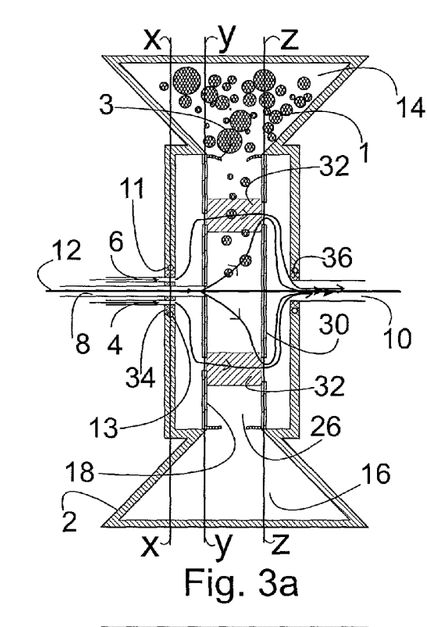
Figure 3B:
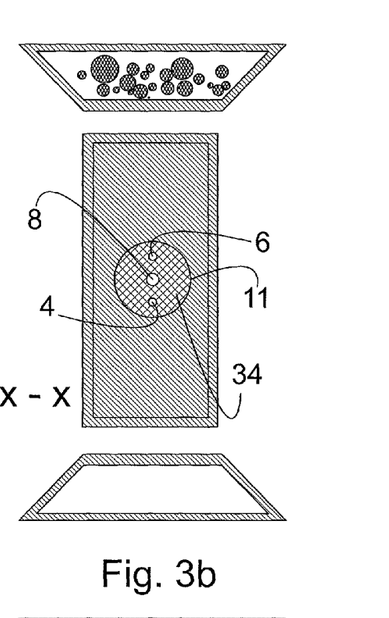
FIG. 3b is a schematic cross-section of the apparatus of FIG. 3a, FIG. 3c is another schematic cross-section of the apparatus of FIG. 3a, FIG. 3d is another schematic cross-section of the apparatus of FIG. 3a, FIG. 3e is an enlarged schematic of an area around a sealed joint in the apparatus of FIG. 3a, FIG. 4 is a schematic cross-section of an apparatus according to one embodiment of the present invention.
Figure 3C:
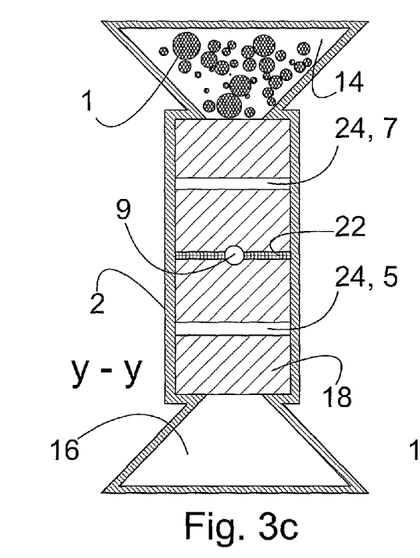
Figure 3D:
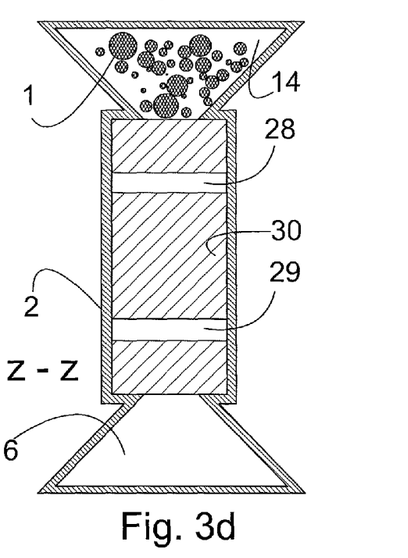
Figure 3E:
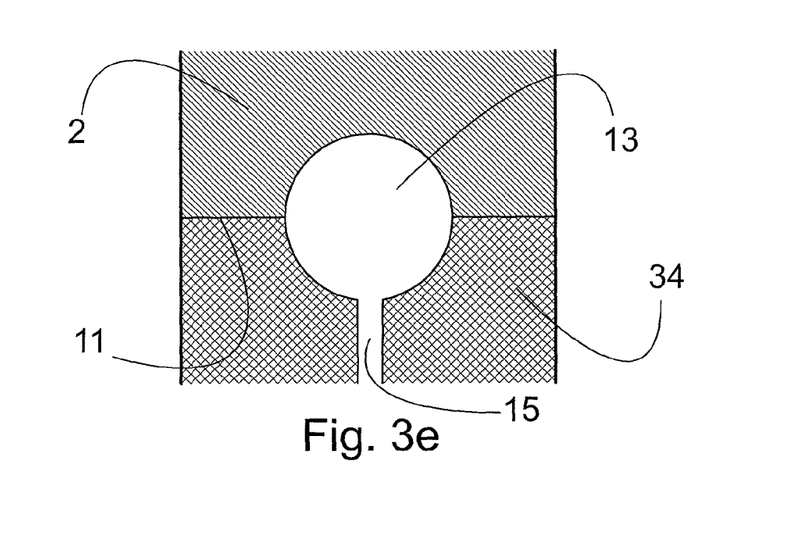

FIG. 3e illustrates an enlargement of a sealing area around the sealed joint 11 in the apparatus of FIG. 3a. The sealed joint 11 resides in between the wall of the reaction chamber 2 and the input area 34 located on the rotation axis 12. A similar joint allowing for rotation can be found on the side of the output area 36 in FIG. 3a as well. The sealed joint 11 enables rotation of the reaction chamber 2 relative to the three feedthroughs into the reaction chamber 2 located in the input area 34. These feedthroughs, in the input side of the reaction chamber 2, are the precursor inputs 4, 6 and the inert gas input 8. As presented in FIG. 3e the sealing area incorporates a purge flow channel 13 in the joint between the reaction chamber 2 and the feedthroughs in the input area 34. The purge flow channel 13 is in flow connection with an inert gas source through a feed channel 15. As inert gas flows into the purge flow channel 13 the gas pressurizes the channel 13, thereby forming a place of higher pressure in between the inside and the outside of the reaction chamber 2. Hence, if the sealed joint 11 leaks on either side of the purge flow channel 13 the inert gas flows from the purge flow channel 13 through the leak in the sealed joint 11 into the reaction chamber and/or outside the reaction chamber and prevents gas from counter flowing or diffusing into the purge flow channel 13 through the leak. The purge flow channel 13 may extend around the feedthroughs and the input area 34, in the apparatus of FIG. 3a. This efficiently isolates the inside and the outside of the reaction chamber 2 from each other. The sealing material in the sealed joint 11 should also allow rotation of the reaction chamber 2 relative to the input 34 and the output 36 areas. In this case, also the separator wall 22 would rotate around the inert gas input 8, and the joint between the inert gas 8 input and the separator wall 22 should be correspondingly sealed.

When the input/output construction of FIGS. 3a-3e is used it is noted that the "switching of precursor inputs" discussed above is automatically carried out by the separator wall 22 which now rotates relative to the precursor inputs 4, 6. When the precursor inputs 4, 6 are switched during rotation of the reaction chamber 2 the feeding of precursors through the precursor inputs 4, 6 can be temporarily cut off letting only inert gas flow through the inputs 4, 6. This is to ensure that different precursors do not mix in the gas phase at the moment of switching, i.e. at the moment when the separator wall 22 slides by a precursor input 4, 6. This purging period may also be used to ensure that reactive elements, e.g. surplus precursors, are flushed away from the reaction chamber 2 before altering the flow configuration of the precursors. The use of a purging period also facilitates sealing of the reaction chamber.

Figure 4:
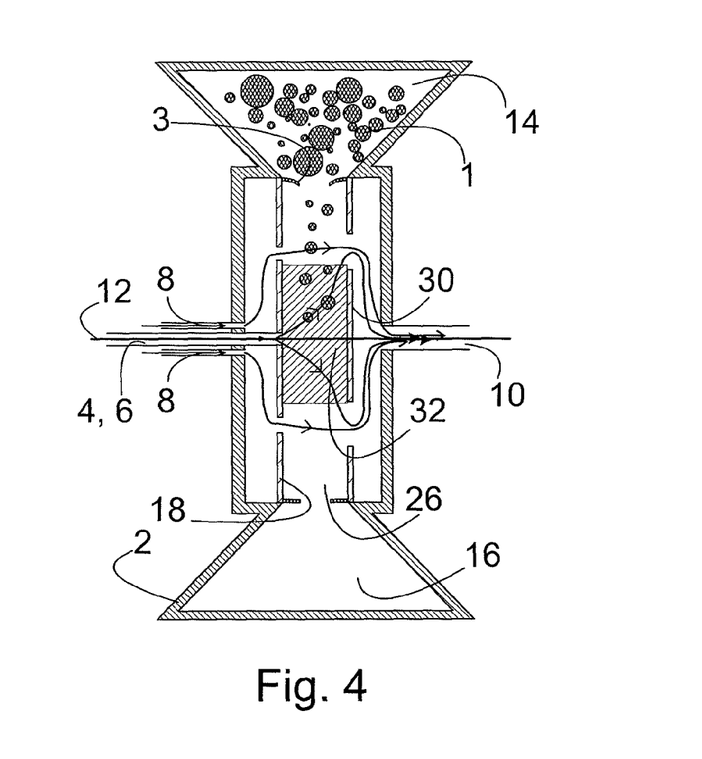

FIG. 4 presents another embodiment of the present invention. This embodiment is similar to the embodiment of FIG. 2a with the exception that only one distinct precursor region 32 is formed in the middle part of the reaction space 26. The different precursors are input through the same precursor input 4, 6, naturally one precursor at a time, whereas the inert gas is input through two different inert gas inputs 8. In this flow configuration the inert gas flow can prevent precursors from diffusing or flowing out of the distinct precursor region 32 into the containers 14, 16. This enables rapid purging of the reaction chamber 2 from precursor vapour when the precursor is switched after each end-to-end passage of the object(s) 1 to be coated. Hence, in this embodiment the object 1 is exposed to only one species of precursor per one end-to-end passage through the reaction space 26.

Figure 5:
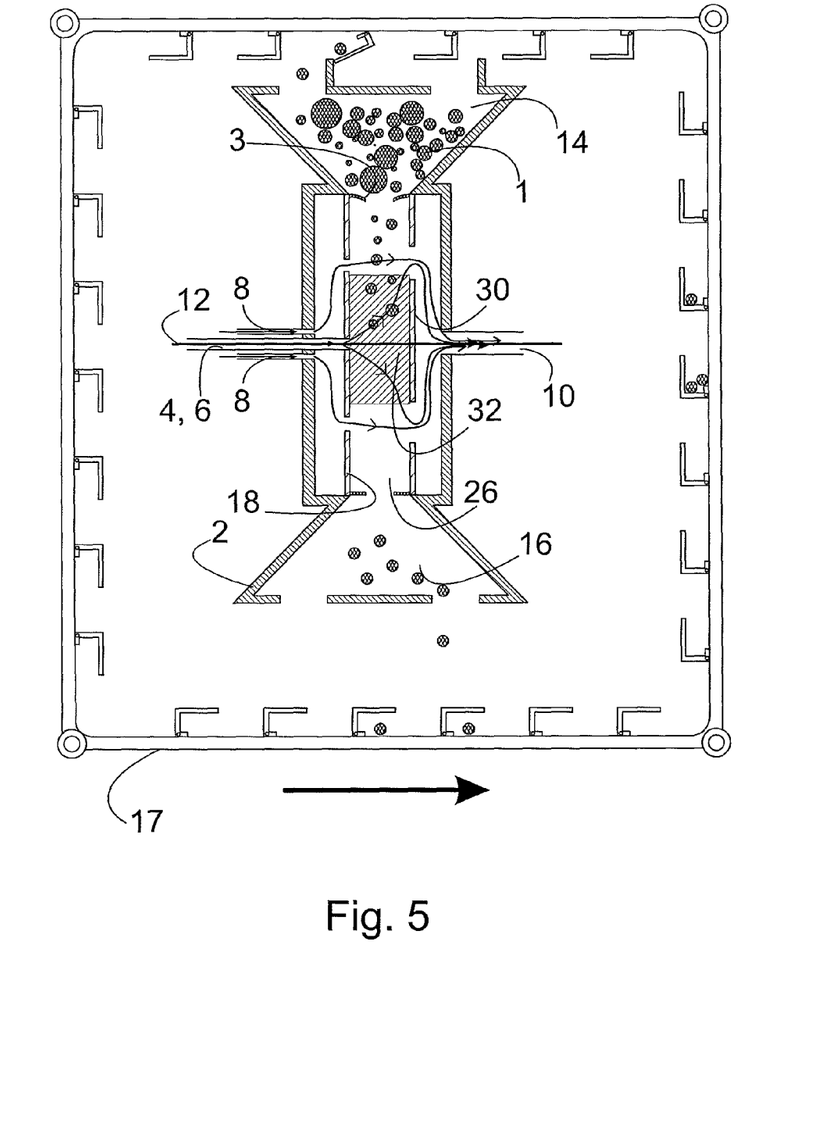
FIG. 5 is a schematic cross-section of an apparatus according to another embodiment of the present invention.

In one embodiment of the invention the object(s) 1 can be continuously introduced to the reaction chamber 2 with a means for transporting 17 the object(s) 1 operating outside the reaction chamber 2. This embodiment is shown in FIG. 5. In this embodiment the reaction chamber 2 is not required to rotate (or to move at all) relative to the inputs 4, 6, 8, to the output 10, to the pipework of the reactor, or to the rest of the reactor system, but the means for transporting 17 takes care of introducing the object(s) 1 to the upper container 14, 16 and removing the object(s) 1 from the lower container 14, 16. In light of this disclosure the exact construction of such a means for transporting 17 will be apparent for the skilled person. In one embodiment of the invention the means for transporting 17 can e.g. decant the object(s) 1 into the upper container 14, 16 from which the object(s) fall through the reaction space 26 and through the one or more distinct precursor regions 32 into the lower container 14, 16, from which the object(s) 1 are removed. The same object(s) 1 can then be transferred, by the means for transporting 17, again up into the upper container 14, 16 to make the object(s) 1 again fall through the reaction space 26. For the means for transporting 17 to operate, the containers 14, 16 have openings through which the object(s) 1 can be introduced to, or removed from, the reaction chamber. In the embodiment of FIG. 5 the means for transporting 17 is essentially a conveyor belt having suitable slots for transporting the object(s) 1, as can be easily deduced from the figure.

In yet another embodiment of the invention an object 1 only goes through one end-to-end passage in the reaction chamber 2 and different objects 1 are continuously supplied into the upper container 14, 16 and removed from the lower container 14, 16. This configuration may be used for e.g. continuous single layer coating in which an object 1 is coated with a coating having a thickness of e.g. one atomic layer.

Figure 6:
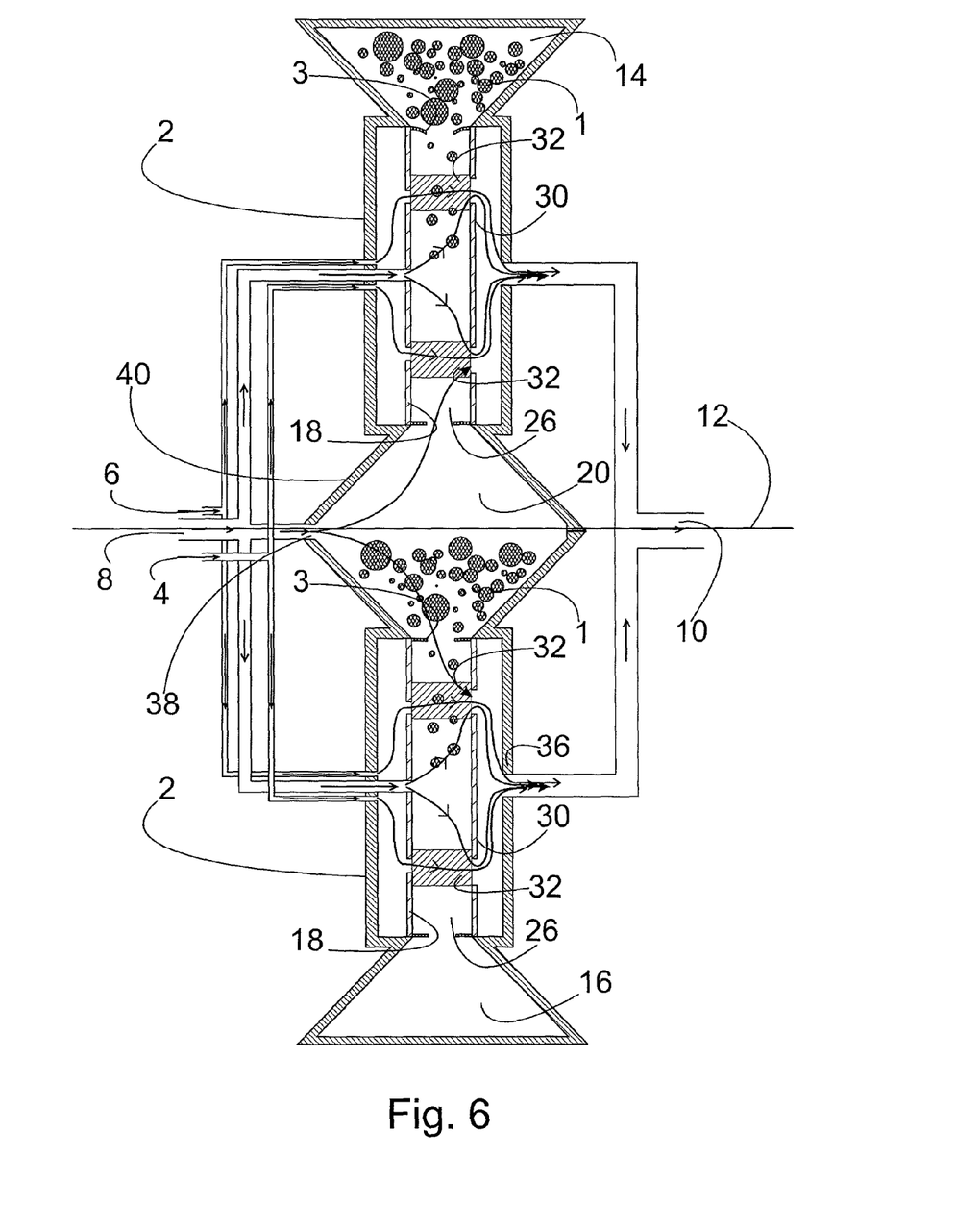
FIG. 6 is a schematic cross-section of an apparatus according to yet another embodiment of the present invention.

FIG. 6 shows a schematic cross-section of an apparatus according to another embodiment of the present invention, where the reaction chamber 40 comprises essentially two elongated chambers 2 joined together via a middle chamber 20 in between them. The apparatus of FIG. 6 additionally comprises piping to bring the inputs 4, 6, 8 and the output 10 close to the rotation axis 12 of the apparatus. An additional inert gas inlet, the middle inlet 38, is located in the middle part of the "triple-chamber" reaction chamber 40, at the point where the two elongated chambers 2 are joined together, to feed inert gas into the middle chamber 20. In the construction of FIG. 6 four distinct precursor regions 32 can be formed by means of three inert gas inlets, of which the middle inlet 38 enables the formation of a diffusion barrier in the middle chamber 20. This minimizes the intermixing and gas-phase reactions between precursors occupying precursor regions 32 closest to the middle chamber 20.

The apparatus of FIG. 6 can be used similarly to the apparatus of FIG. 2a, e.g. in an ALD reactor to coat objects 1 in an ALD or in an ALD-like process based on alternating surface reactions of two or more different precursors. Correspondingly to the apparatus of FIG. 2a, rotating the apparatus of FIG. 6 by e.g. 180 degrees around its axis of rotation 12 can cause objects 1 stored in the first container 14 in one end of the reaction chamber 40 to fall through the four distinct precursor regions 32. By suitably choosing the precursors, for e.g. an ALD process, an object 1 can go through two ALD-cycles worth of coating in one end-to-end passage through the distinct precursor regions 32.

The reaction chambers 2 of FIG. 2a can be joined together at will in a similar manner that has been done for constructing the apparatus of FIG. 6. This enables the formation of a bigger number of distinct precursor regions 32 inside the reaction space 26 of the elongated chamber, which, on the other hand, enables coating of the objects 1 with a thicker film (corresponding to more ALD-cycles) in one end-to-end passage in a given ALD or ALD-like process. It also presents the possibility to use more complex processes including a bigger number of different precursors.

Figure 7:
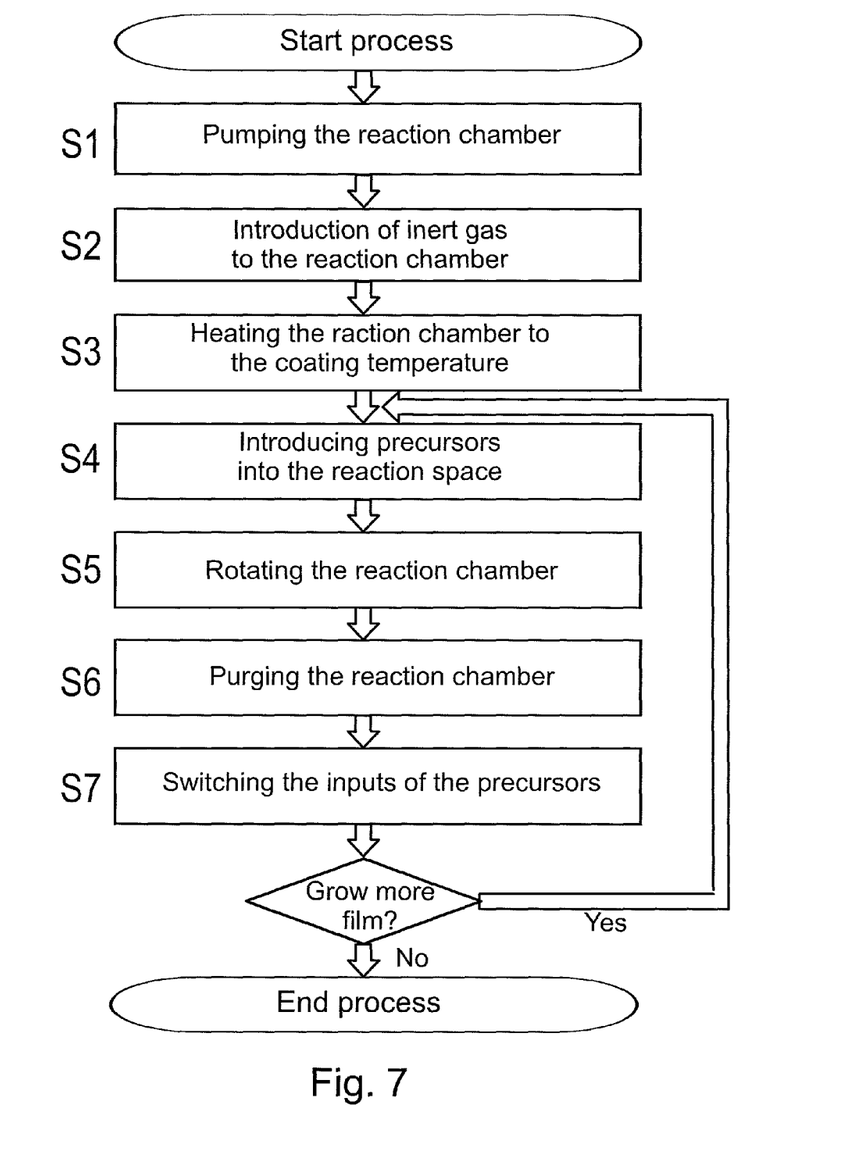
FIG. 7 is a flow-chart presentation of a method according to one embodiment of the present invention.

When using the apparatuses of the aforementioned exemplary embodiments there are several possibilities related to the relative timing of the rotation of the apparatus and to the introduction of the precursors to the reaction space 26. Among other things, the timing depends on e.g. how the apparatus is connected to the rest of a reactor system and whether switching of the precursor inputs 4, 6 is desired after an end-to-end passage of the objects. The flow chart of FIG. 7 presents a method for coating one or more objects 1 according to one embodiment of the present invention. The method of FIG. 7 can be used e.g. with an apparatus of FIG. 2a or FIG. 6. In the presented method the inputs 4, 6 of the two different precursors are switched after each end-to-end passage of the one or more objects 1.

The objects 1 are loaded into a container 14, 16 at one end of the reaction chamber 2, 40. The objects 1 can be loaded through e.g. a loading hatch or a load lock (not shown in the figures), the mechanical constructions of which will be obvious for a skilled person in light of this disclosure. The objects 1 can be loaded e.g. into the container 14, 16 at the lower end of the reaction chamber. The method of FIG. 7 begins by pumping the reaction chamber 2, 40 to vacuum (step S1) after loading the objects 1 into the reaction chamber 2, 40. Pumping is carried out through the output 10 leading to a vacuum pumping system of a reactor system, e.g. an ALD reactor. When a suitably low pressure for coating is achieved, inert gas flow is started (step S2) by opening a valve connecting the inert gas input 8 to an inert gas source. This purges the reaction chamber 2, 40 from air or other possibly reactive substances. After heating the reaction chamber 2, 40 to a suitable coating temperature (step S3), coating of the objects 1 is started. A suitable coating pressure and coating temperature depends on e.g. a specific ALD or ALD-like process, and these parameters along with other process parameters can be readily selected by the skilled professional.

The objects 1 are coated e.g. by first letting the two different precursors flow through the reaction chamber 2, 40 (along with possible inert carrier gas) from the precursor inputs 4, 6 to the output (step S4). This can be done by e.g. opening valves connecting the precursor inputs 4, 6 to their respective sources. This causes the flow paths of the two precursors to form the distinct precursor regions 32 inside the reaction space 26. Subsequently the reaction chamber 2, 40 is rotated (step S5), e.g. 180 degrees, depending on the initial position of the reaction chamber 2, 40, such that the objects 1 fall through the distinct precursor regions 32 to the container 14, 16 at the other end of the reaction chamber 2, 40. After an end-to-end passage of the objects 1 the feeding of the precursors is stopped for a short period of time (step S6) before switching the inputs 4, 6 of the two precursors (step S7). The purging period of step S6 ensures that the two precursors do not significantly come into contact with each other when a different precursor is guided into the input 4, 6 previously occupied by another precursor. An ALD-cycle can be repeated by repeating steps S4-S7.

EXAMPLES

An apparatus according to one embodiment of the present invention, similar to the apparatus of FIG. 2a, was used in an ALD reactor to coat small spherical polymer granules (diameter of about 2 mm) with 3 nm of aluminum oxide. The coating process was an ALD-process based on alternately exposing the surface of the granules to trimethylaluminum (TMA) and de-ionized water. The process followed essentially the flow-chart of FIG. 7. The inert gas used in the process was nitrogen ($N_2$) which was also used as the carrier gas for both precursors. The processing temperature and processing pressure inside the reaction space 26 were 60° C. and 1 hPa (1 mbar), respectively.

The objects 1, i.e. the granules, were loaded into the container 14, 16 at the lower end of the elongated reaction chamber 2 through a hatch in the wall of the reaction chamber 2. The elongated reaction chamber 2 was kept vertical during loading. After pumping the reaction chamber 2 to the coating pressure, a continuous flow of nitrogen gas was initiated through the inert gas input 8. The reaction chamber 2 was subsequently heated to the coating temperature.

Coating of the granules 1 was initiated by opening valves connecting the TMA and $H_2O$ sources to their respective inputs; TMA vapour was guided to the first precursor input 4 and $H_2O$ vapour to the second precursor input 6 in a mixture comprising the $N_2$ carrier gas. Next, the reaction chamber 2 was rotated 180 degrees using an electric motor (a pneumatic pressure driven actuator could be used as well), causing the granules 1 to drop first through a distinct precursor region 32 occupied by TMA and then through another distinct precursor region 32 occupied by $H_2O$ inside the reaction space 26. After all the granules 1 had fallen to the container 14, 16 at the other end of the elongated reaction chamber 2 the precursor flows were interrupted, enabling the continuous flow of inert gas, through the inert gas input 8 as well as through the precursor inputs 4, 6, to purge the reaction chamber 2 from surplus precursors or other reactive substances. After purging, the precursor inputs 4, 6 were switched by now guiding $H_2O$ to the first precursor input 4 and TMA to the second precursor input 6, and introducing the precursors into the reaction space 26 through their new inputs 4, 6. Then the reaction chamber 2 was rotated again to coat the granules with a second ALD-cycle including a TMA exposure followed by an exposure with de-ionized water.

The reaction chamber 2 was rotated 180 degrees about 30 times to coat the granules 1 with an aluminum oxide coating having a thickness of about 3 nm. The growth rate of the aluminum oxide was about 0.1 nm (1 Angstrom) per one ALD-cycle in the prevailing process conditions.

Coating of small sized particles may be used in many ways to provide additional functionality to a material and/or to enable the fabrication of new materials. This is disclosed in more detail by the following example. An apparatus according to one embodiment of the present invention was used to coat polyamide particles having a diameter of about 60 μm with a thin film of $TiO_2$. The coating process was based on alternately exposing the surface of the polymer particles to titanium tetrachloride and de-ionized water. The thickness of the $TiO_2$ film was about 10 nm, and the temperature during deposition can be about 50-220° C. depending on the exact polymer substrate material. In the case of this polyamide substrate material the temperature was about 220° C.

Examples of inorganic materials that may be deposited onto polymer substrates include metal oxides, e.g. titanium oxide, tantalum oxide, niobium oxide, aluminium oxide, zirconium oxide, hafnium oxide, tin oxide, zinc oxide, lanthanum oxide and silicon oxide in their various phases. Suitable polymer substrate materials for these coating materials can include e.g. polyolefins, polyesters, polystyrene, polymethyl methacrylate, polycarbonate and polyvinylchloride.

After the deposition (or coating) the polymer substrates (the particles) having the deposit on their surface were taken out from the deposition tool for melt processing. Within the context of this example, "melt processing" refers to any method involving melting the polymer substrate e.g. polymer granulates/particles together with the deposit on their surface (e.g. extrusion processing). Upon extrusion processing or other melt processing, the high shear breaked the inorganic $TiO_2$ deposit around the polymer particles and dispersed the remnants of the deposit into the melt polymer to form a composite (nanocomposite) with an essentially homogeneous dispersion of the inorganic $TiO_2$ filler. By melt processing methods, the resulting nanocomposite material may also be formed into final plastic articles, or into some intermediate form (e.g. into granulates) that may later undergo further processing.

When measured, the obtained nanocomposite displayed an increase in Young's modulus and tensile strength compared to known nanocomposite materials with the same substrate material. A decreased viscosity of the plastic nanocomposite was noticeable already during the melt processing step, as conventional extruders may encounter difficulties in holding back a plastic composite with extremely low viscosity. Viscosity measurements indicated that a concentration of about 0.1 volume percent (about 0.4 weight-percent) of the inorganic $TiO_2$ filler in a polyamide polymer matrix results in about 80 percent decrease in the value of viscosity. For comparison, a concentration of 2 weight-percent of $TiO_2$ filler in a polyamide polymer matrix, in a nanocomposite prepared using conventional melt compounding methods, increases viscosity by about 50 percent. The coated polymer particles may also be used as an additive, whereby they are mixed with an appropriate amount of uncoated polymer material. After this mixing step the mixture of coated and uncoated polymer is melt processed to obtain a nanocomposite.

Although the aforementioned examples disclose coating processes for polymer granules or particles, it is again emphasized that the invention is not limited to coating objects 1 (particles) with a specific shape, size, weight or material. The invention is also not limited to any particular coating material, and although some possible examples of many suitable coating materials are mentioned above, many combinations of these and other materials and different phases can be conceived.

As is clear for a person skilled in the art, the invention is not limited to the examples described above but the embodiments can freely vary within the scope of the claims.

The invention claimed is:

1. A method for coating one or more objects, comprising; introducing a first precursor to a reaction chamber; introducing a second precursor to the reaction chamber; and exposing an object to alternately repeating surface reactions of two or more gaseous precursors inside the reaction chamber, wherein the method comprises forming at least one distinct precursor region inside the reaction chamber, and causing translational, mechanically unsupported and unsuspended, motion of an object inside the reaction chamber, relative to the reaction chamber, for bringing the surface of the object into contact with a gaseous precursor, and for moving the object through the at least one distinct precursor region inside the reaction chamber so that the object falls into and out of the distinct precursor region while the object is within the reaction chamber.

2. The method of claim 1, wherein causing the translational, mechanically unsupported and unsuspended, motion comprises causing the motion by rotating the reaction chamber, such that the gravitational force makes the object fall through at least one distinct precursor region occupied by a precursor inside the reaction chamber.

3. The method of claim 1, wherein the method comprises the step of transporting the object from one part of the reaction chamber into another part of the reaction chamber, the transport being carried outside the reaction chamber.

4. The method of claim 1, wherein causing the translational, mechanically unsupported and unsuspended, motion of an object makes the object move through two or more distinct precursor regions occupied by at least two different precursors inside the reaction chamber, wherein only one precursor occupies one region.

5. The method of claim 1, wherein exposing an object to alternately repeating surface reactions of two or more precursors comprises exposing the object to alternately repeating self-limiting surface reactions, for coating the object by atomic layer deposition.

6. The method of claim 1, wherein the method comprises the step of
    separating the main flow of each precursor inside a reaction space within the reaction chamber in time and/or in space, to prevent significant reactions from occurring between precursors in the gas phase.

7. The method of claim 1, wherein the method comprises the step of
    feeding inert gas such that the main flow paths of different precursors are kept separated in space.

8. The method of claim 1, wherein the method comprises the step of
    feeding at least two precursors simultaneously through the reaction chamber in gaseous form, the main flow path of one precursor inside the reaction space within the reaction chamber being separated from the main flow path of any other precursor.

9. The method of claim 1, wherein the method comprises the step of
    feeding inert gas into the reaction space through an inlet for the inert gas located in between an inlet for a first precursor and an inlet for a second precursor, such that flow of the inert gas inside the reaction space is divided between a first outlet and a second outlet located at a distance from each other, for keeping the main flow paths of the first precursor and of the second precursor separated inside the reaction space.

10. The method of claim 1, wherein the method comprises moving the object in an unidirectional manner through the at least one distinct precursor region during one pulsing sequence.

* * * * *